United States Patent
Saki et al.

(10) Patent No.: US 10,106,107 B2
(45) Date of Patent: Oct. 23, 2018

(54) WATERPROOF TYPE CONTROL UNIT AND WATERPROOF TYPE CONTROL UNIT MANUFACTURING METHOD

(71) Applicant: Mitsubishi Electric Corporation, Tokyo (JP)

(72) Inventors: Ryoji Saki, Tokyo (JP); Hideya Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/513,633

(22) PCT Filed: Nov. 13, 2014

(86) PCT No.: PCT/JP2014/080061
§ 371 (c)(1),
(2) Date: Mar. 23, 2017

(87) PCT Pub. No.: WO2016/075788
PCT Pub. Date: May 19, 2016

(65) Prior Publication Data
US 2017/0291561 A1  Oct. 12, 2017

(51) Int. Cl.
*H05K 5/06* (2006.01)
*H01R 13/52* (2006.01)
(Continued)

(52) U.S. Cl.
CPC ...... *B60R 16/0239* (2013.01); *B29C 45/0053* (2013.01); *B29C 45/14778* (2013.01);
(Continued)

(58) Field of Classification Search
CPC .. H01R 13/5202; H01R 13/5216; H05K 5/06; H05K 5/062
See application file for complete search history.

(56) References Cited

U.S. PATENT DOCUMENTS 8,038,914 B2 * 10/2011 Suzuki .............. B29C 45/14377
264/255
8,942,001 B2 * 1/2015 Kawai .................. H05K 5/0052
174/50.5
(Continued)

FOREIGN PATENT DOCUMENTS

JP  11-307658 A  11/1999
JP  2004-72876 A  3/2004
(Continued)

OTHER PUBLICATIONS

International Search Report for PCT/JP2014/080061, dated Feb. 17, 2015.
(Continued)

*Primary Examiner* — Adrian S Wilson
(74) *Attorney, Agent, or Firm* — Sughrue Mion, PLLC; Richard C. Turner

(57) ABSTRACT

A peripheral wall includes a first peripheral wall edge portion and a second peripheral wall edge portion, which are disposed on a case member bottom surface so as to be distant from each other. A connector member main unit is disposed in a space between the first and second peripheral wall edge portions. A peripheral wall groove, which is open toward the connector member main unit, is disposed in each of the first and second peripheral wall edge portions. A bottom surface of the peripheral wall groove is inclined with respect to the case member bottom surface. A base plate groove is disposed on the bottom surface of the case member. A seal material is filled into the space formed between each of an inner surface of the peripheral wall groove and an inner surface of the base plate groove, and the connector member.

15 Claims, 17 Drawing Sheets

(51) Int. Cl.
*B60R 16/023* (2006.01)
*B29D 99/00* (2010.01)
*B29C 45/14* (2006.01)
*B29C 45/00* (2006.01)
*H05K 5/00* (2006.01)
*H05K 5/02* (2006.01)
*H05K 5/03* (2006.01)

(52) U.S. Cl.
CPC ....... *B29D 99/006* (2013.01); *H01R 13/5202* (2013.01); *H01R 13/5216* (2013.01); *H05K 5/0004* (2013.01); *H05K 5/0017* (2013.01); *H05K 5/0247* (2013.01); *H05K 5/03* (2013.01); *H05K 5/062* (2013.01); *B29K 2995/0069* (2013.01)

(56) References Cited

U.S. PATENT DOCUMENTS

| | | | |
|---|---|---|---|
| 9,078,367 B2* | 7/2015 | Tamura | H05K 5/0052 |
| 2002/0112870 A1* | 8/2002 | Kobayashi | H05K 5/0052 174/50 |
| 2005/0095922 A1* | 5/2005 | Berg | B29C 45/14344 439/736 |
| 2007/0109730 A1 | 5/2007 | Shigyo et al. | |
| 2009/0237896 A1* | 9/2009 | Yamauchi | H05K 5/0069 361/752 |
| 2011/0235289 A1* | 9/2011 | Watanabe | H05K 5/0052 361/752 |
| 2014/0085839 A1* | 3/2014 | Nakano | H05K 5/0052 361/752 |

FOREIGN PATENT DOCUMENTS

| | | |
|---|---|---|
| JP | 2012-69611 A | 4/2012 |
| JP | 2013-89878 A | 5/2013 |
| JP | 2013-165107 A | 8/2013 |
| JP | 2014-86644 A | 5/2014 |
| JP | 2014-116504 A | 6/2014 |

OTHER PUBLICATIONS

Extended European Search Report dated Jun. 1, 2018 issued by the European Patent Office in counterpart European application No. 14905897.6.

* cited by examiner

WATERPROOF TYPE CONTROL UNIT AND WATERPROOF TYPE CONTROL UNIT MANUFACTURING METHOD

CROSS REFERENCE TO RELATED APPLICATIONS

This is a National Stage of International Application No. PCT/JP2014/080061 filed Nov. 13, 2014, the contents of all of which are incorporated herein by reference in their entirety.

TECHNICAL FIELD

This invention is related to a waterproof type control unit, which is installed in an automobile, for example, and a waterproof type control unit manufacturing method.

BACKGROUND ART

A control unit of which case is constituted by a base, a cover and a connector member, and of which circuit board is disposed inside the case, has been known. On each periphery of the base, the cover and the connection member, a joining surface on which a convex line or a concave line is formed, is disposed. On each boundary of the base, the cover and the connector member, a seal portion is formed where the convex line and the concave line facing each other are coated with a seal material and engaged with each other, in order to improve waterproof performance (see PTL 1).

CITATION LIST

Patent Literature

[PTL 1] Japanese Patent Application Publication No. 2012-69611

SUMMARY OF INVENTION

Technical Problem

However, the side face and the top face formed on the periphery of the connector member are at right angles to each other, hence when the connector member and the cover are joined, the direction of an injection needle of a coating machine, to coat a seal material, must be changed between the top face and the side face of the connector member. This means that it takes time to coat the seal material on the cover and the connector member, therefore the operation to manufacture the control unit requires time.

With the foregoing in view, it is an object of the invention to provide a waterproof type control unit that can reduce the time required for manufacturing, and to provide a method for manufacturing the waterproof type control unit.

Solution to Problem

A waterproof type control unit according to this invention has: a case including a case assembly in which an opening is disposed; and a cover which closes the opening; and a controller which is housed in the case, wherein the case assembly includes a case member and a connector member which is attached to the case member, the case member has: a base plate on which a case member bottom surface is formed; and a peripheral wall which is fixed to the base plate and which includes a first peripheral wall edge portion and a second peripheral wall edge portion, which are disposed on the case member bottom surface so as to be distant from each other, the peripheral wall surrounding the controller from the first peripheral wall edge portion to the second peripheral wall edge portion, the connector member includes a connector member main unit, which is disposed in a space between the first peripheral wall edge portion and the second peripheral wall edge portion, the opening is formed by being surrounded by the peripheral wall and the connector member main unit, a peripheral wall groove, which is open toward the connector member main unit, is disposed in each of the first peripheral wall edge portion and the second peripheral wall edge portion, the bottom surface of the peripheral wall groove is inclined with respect to the case member bottom surface, a base plate groove, which connects the peripheral wall groove disposed in the first peripheral wall edge portion and the peripheral wall groove disposed in the second peripheral wall edge portion, is disposed in the case member bottom surface, and a seal material is filled in a space formed between an inner surface of the peripheral wall groove and the connector member, and a space formed between an inner surface of the base plate grove and the connector member.

Advantageous Effects of Invention

According to the waterproof type control unit based on this invention, the bottom surfaces of the peripheral wall grooves disposed in the first and second peripheral wall edge portions are inclined with respect to the case member bottom surface, and the base plate groove connecting these peripheral wall grooves is disposed in the case member bottom surface, hence the seal material can be injected into the peripheral wall grooves and the base plate groove respectively through the injection needle without changing the direction of the injection needle with respect to the case member bottom surface 611. Thereby operation to coat the seal material to the case member becomes easy, and the time required for manufacturing the waterproof type control unit can be decreased.

DESCRIPTION OF EMBODIMENTS

Preferred embodiments of this invention will be described with reference to the drawings.

Embodiment 1

Figure 1:
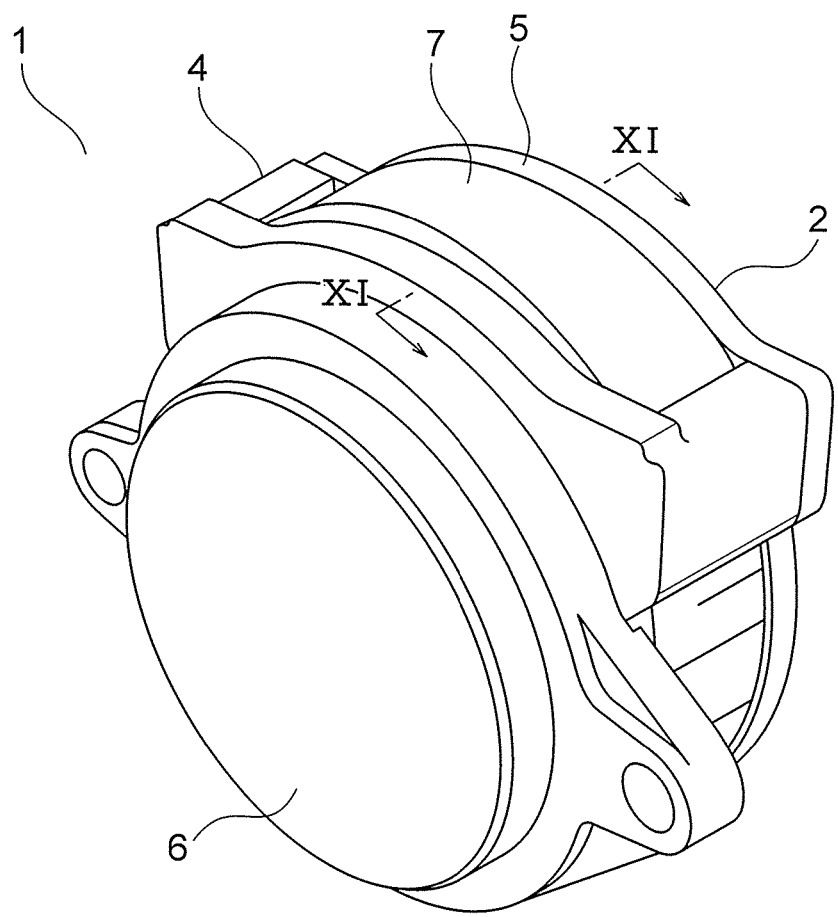
FIG. 1 is a perspective view depicting a waterproof type control unit according to Embodiment 1 of this invention.
Figure 2:
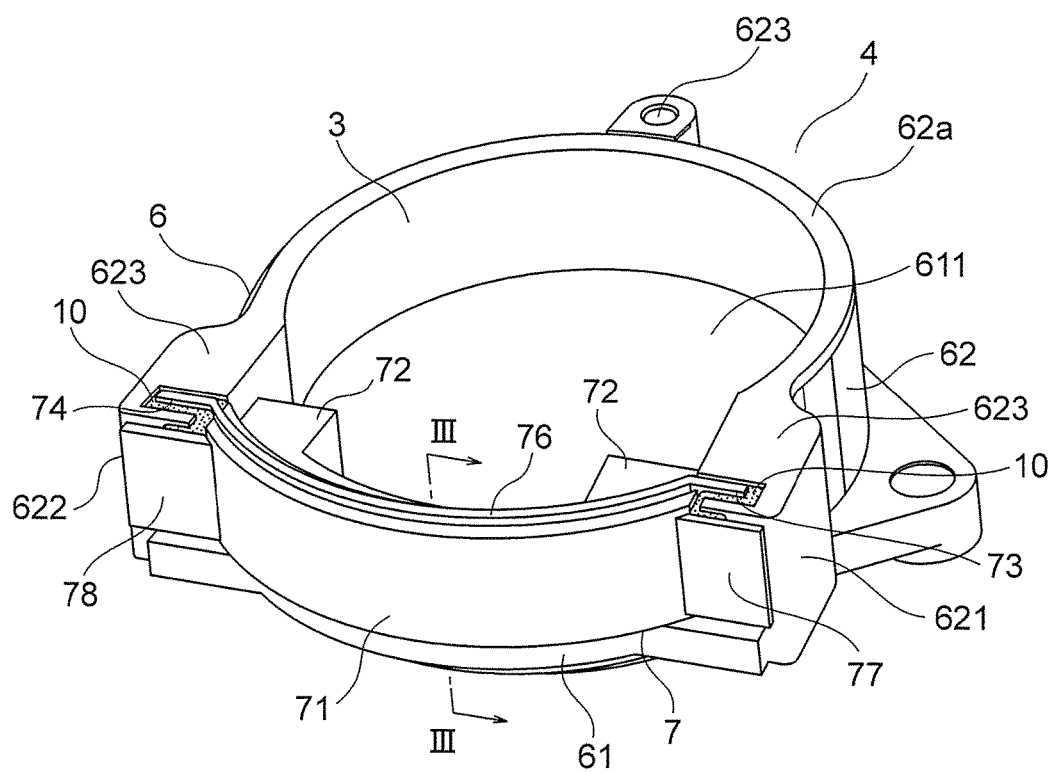
FIG. 2 is a perspective view depicting a case assembly in FIG. 1.
Figure 3:
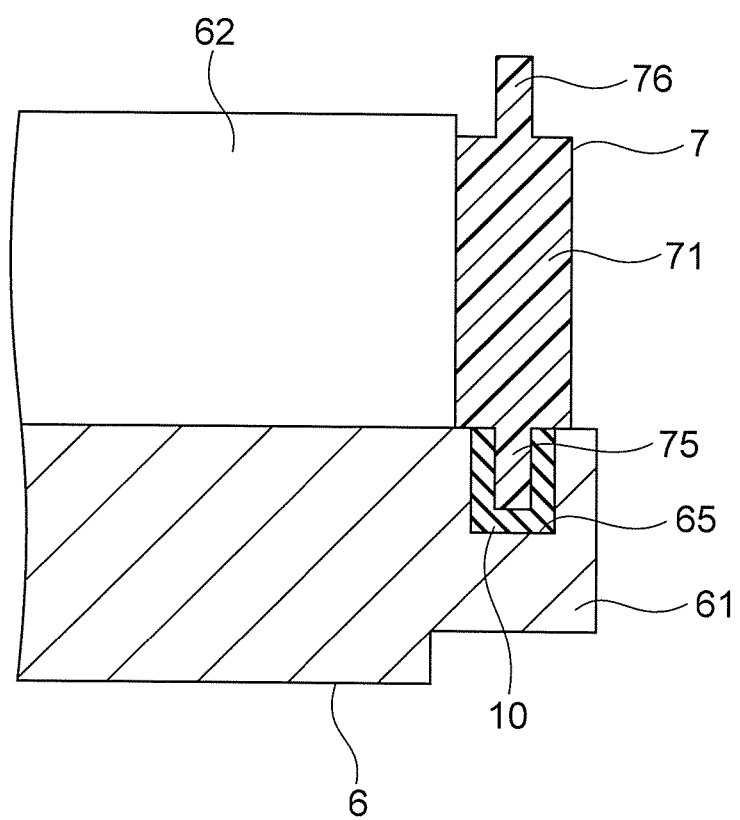
FIG. 3 is a cross-sectional view along the III-III line in FIG. 2.

In this embodiment, a vehicular waterproof type control unit, which is installed in an automobile, for example, will be described. FIG. 1 is a perspective view depicting the waterproof type control unit according to Embodiment 1 of this invention. FIG. 2 is a perspective view depicting a case assembly 4 in FIG. 1, and FIG. 3 is a cross-sectional view along the III-III line in FIG. 2. In the drawings, the waterproof type control unit 1 has a case 2 and a controller (not illustrated) which is housed in the case 2. The case 2 includes: a case assembly 4 which has an opening 3 illustrated in FIG. 2; and a cover 5 which closes the opening 3 of the case assembly 4. As illustrated in FIG. 2, the case assembly 4 includes: a case member 6 which supports the controller; and a connector member 7 which is attached to the case member 6. In this example, the cover 5 and the case member 6 are constituted of a same material (aluminum metal) formed by die casting, and the connector member 7 is constituted of a material that is different from the cover 5 and the case member 6.

As illustrated in FIG. 2, the case member 6 has a base plate 61 and a peripheral wall 62 that is fixed to the base plate 61. A case member bottom surface 611, which faces the cover 5, is formed on the base plate 61. The controller is supported by the case member bottom surface 611 of the base plate 61.

The peripheral wall 62 is fixed to the case member bottom surface 611 of the base plate 61. The peripheral wall 62 also has a first peripheral wall edge portion 621 and a second peripheral wall edge portion 622, which are disposed on the case member bottom surface 611 so as to be distant from each other. The peripheral wall 62 surrounds the controller from the first peripheral wall edge portion 621 to the second peripheral wall edge portion 622. In this example, the shape of the peripheral wall 62, viewed from the cover 5 side, is C-shaped. A seal surface 62a is formed along the peripheral wall 62 on the surface of the peripheral wall 62 on the cover 5 side, that is, on the top surface of the peripheral wall 62. Further, a plurality of (3 in this example) screw holes 623 are disposed in the peripheral wall 62 with intervals there between. The cover 5 is fastened to the peripheral wall 62 by a plurality of (3 in this example) screws (not illustrated), which are fasteners inserted through the screw holes 623.

As illustrated in FIG. 2, the connector member 7 includes a connector member main unit 71 which is disposed in a space between the first peripheral wall edge portion 621 and the second peripheral wall edge portion 622. When the connector member 7 is viewed from the cover 5 side, the connector member main unit 71 has a curved shape which curves outward from the case assembly 4, with respect to the line connecting the first peripheral wall edge portion 621 and the second peripheral wall edge portion 622.

In the intermediate portion of the connector member main unit 71, a plurality of connectors (not illustrated, which include external connection terminals electrically connected to the controller, are disposed, and a pair of protrusions 72, which protrude into the case 2, are disposed on both end portions of the connector member main unit 71. The connector member 7 is fixed to the base plate 61 as the protrusions 72 are fastened to the case member bottom surface 611 by fasteners, which are not illustrated. Due to this feature, positioning of the connector member 7 is implemented relative to the base plate 61. The opening 3 of the case assembly 4 is formed by being surrounded by the peripheral wall 62 and the connector member main unit 71.

Figure 4:
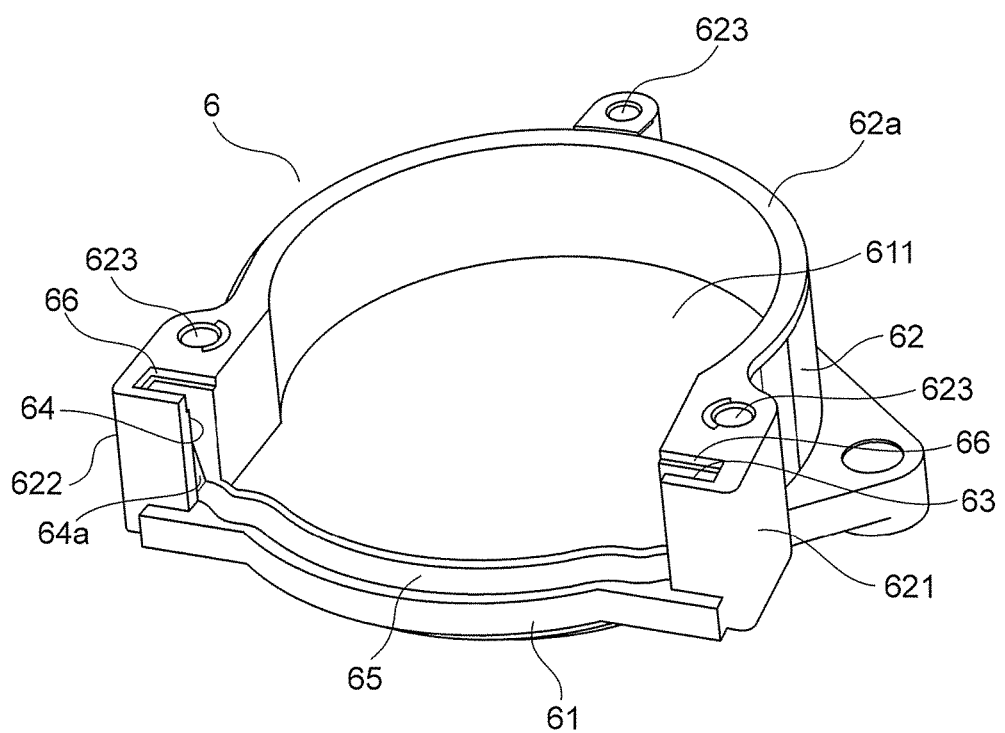
FIG. 4 is a perspective view depicting a case member in FIG. 2.
Figure 5:
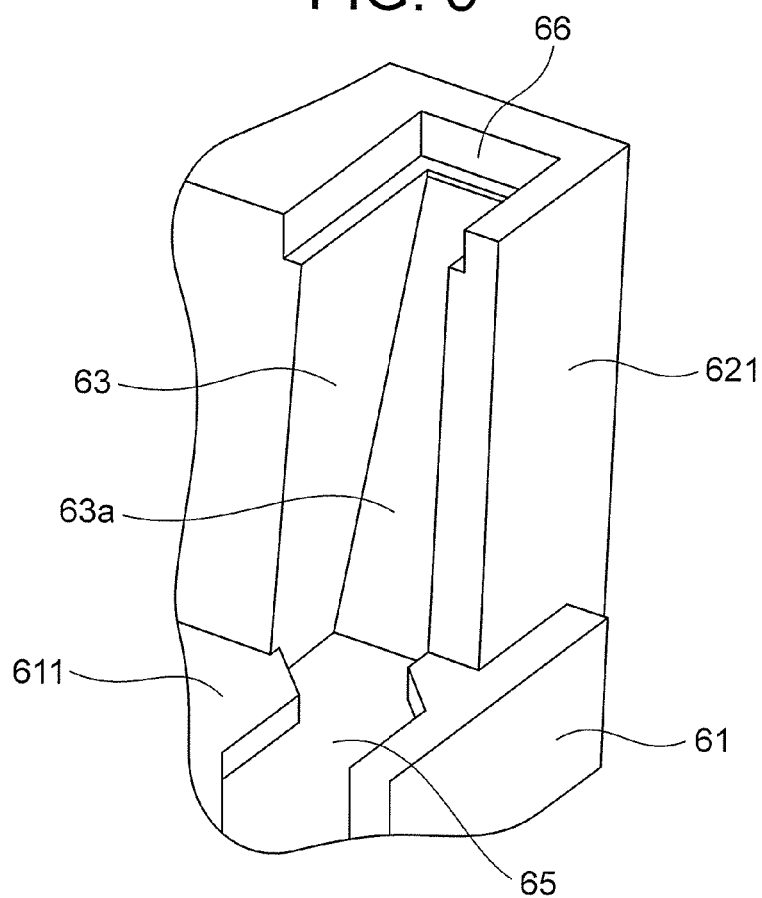
FIG. 5 is a perspective view depicting a first peripheral wall edge portion in FIG. 4.
Figure 6:
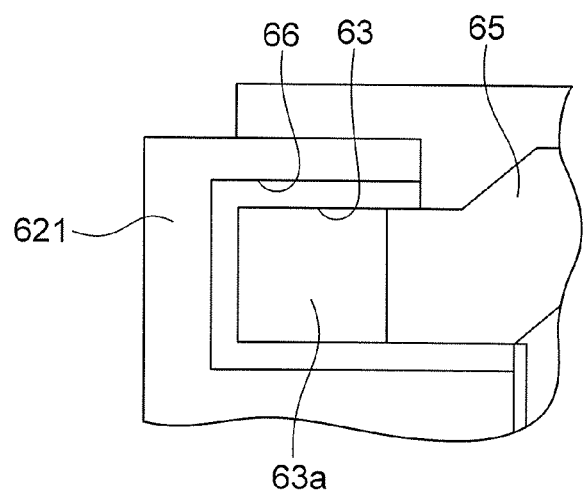
FIG. 6 is a top view depicting the first peripheral wall edge portion in FIG. 5.

FIG. 4 is a perspective view depicting the case member 6 in FIG. 2. FIG. 5 is a perspective view depicting the first peripheral wall edge portion 621 in FIG. 4, and FIG. 6 is a top view depicting the first peripheral wall edge portion 621 in FIG. 5. A peripheral wall groove 63 is formed in the first peripheral wall edge portion 621, and a peripheral wall groove 64 is formed in the second peripheral wall edge portion 622. Each peripheral wall groove 63 and 64 opens toward the connector member main unit 71, and also opens to the cover 5 side. In this example, when the first and second peripheral wall edge portions 621 and 622 are viewed from the cover 5 side, the peripheral wall grooves 63 and 64 face each other via the connector member main unit 71.

Each bottom surface 63a and 64a of each peripheral wall groove 63 and 64 is inclined toward the cover 5 with respect to the case member bottom surface 611. In other words, each bottom surface 63a and 64a of each peripheral wall groove 63 and 64 is a surface crossing with the line perpendicular to the case member bottom surface 611. The distance between each bottom surface 63a and 64a of each peripheral wall groove 63 and 64 and the connector member main unit 71 continuously increases as the distance from the case member bottom surface 611 to the cover 5 decreases. In other words, the direction in which the bottom surface 63a of one peripheral wall groove 63 inclines with respect to the case member bottom surface 611, and the direction in which the bottom surface 64a of the other peripheral wall groove 64 inclines with respect to the case member bottom surface 611, are opposite from each other.

A seal material containing portion 66, which is a space that opens to the cover 5 side, is disposed on the edge portion of each peripheral wall groove 63 and 64 on the cover 5 side. The seal material containing portion 66 is formed by creating a step difference on an inner wall of each peripheral wall groove 63 and 64. When the first and second peripheral wall edge portions 621 and 622 are viewed from the cover 5 side, the inner surface of each seal material containing portion 66 is located outside the inner surface of each peripheral wall groove 63 and 64. As a result, when the first and second peripheral wall edge portions 621 and 622 are viewed from the cover 5 side, the region of each seal material containing portion 66 is larger than the region of each peripheral wall groove 63 and 64.

As illustrated in FIG. 3 and FIG. 4, a base plate groove 65, which connects one peripheral wall groove 63 and the other peripheral wall groove 64, is disposed in the case member bottom surface 611 of the base plate 61. Thereby when viewed from the cover 5 side, each peripheral wall groove 63 and 64 and the base plate groove 65 are continuous in the sequence of one peripheral wall groove 63, the base plate groove 65 and the other peripheral wall groove 63. The base plate groove 65 opens toward the connector member main unit 71. Further, when viewed from the cover 5 side, the base plate groove 65 is disposed on the case member bottom surface 611 along the path of the connector member main unit 71, from the first peripheral wall edge portion 621 to the second peripheral wall edge portion 622.

Figure 7:
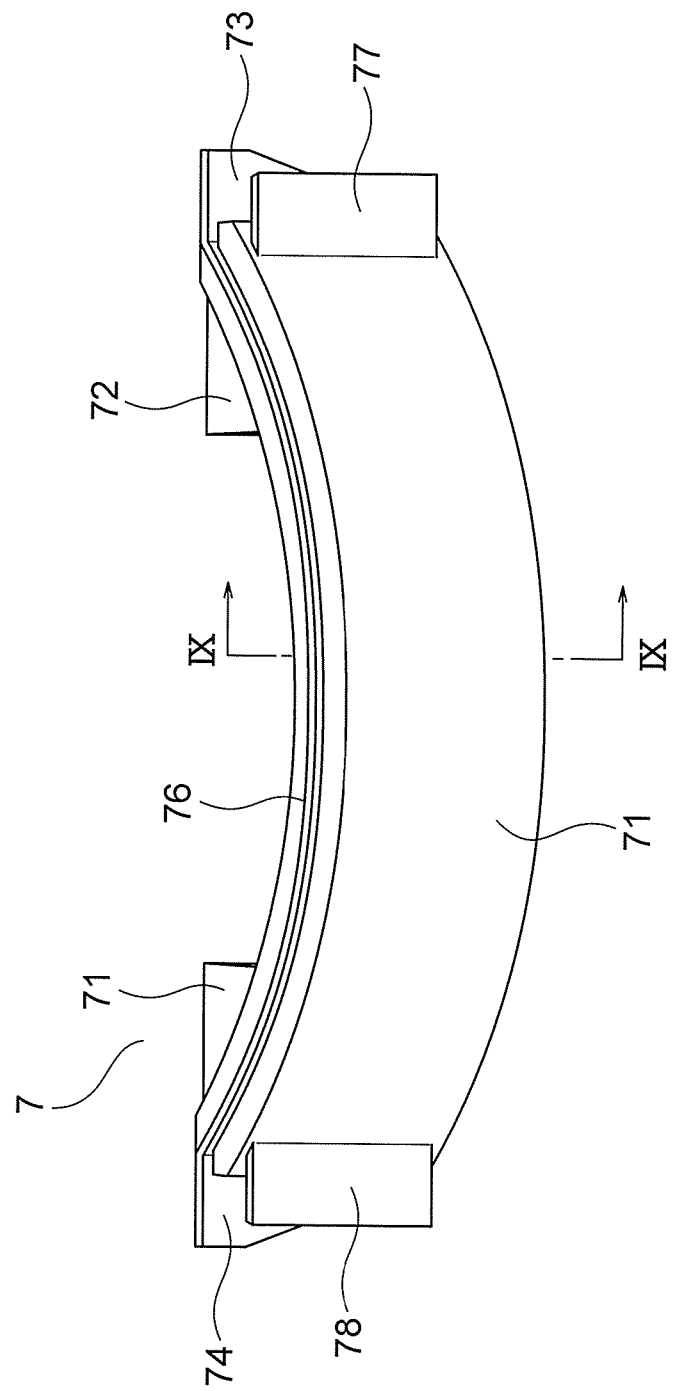
FIG. 7 is a perspective view depicting a connector member in FIG. 2.
Figure 8:
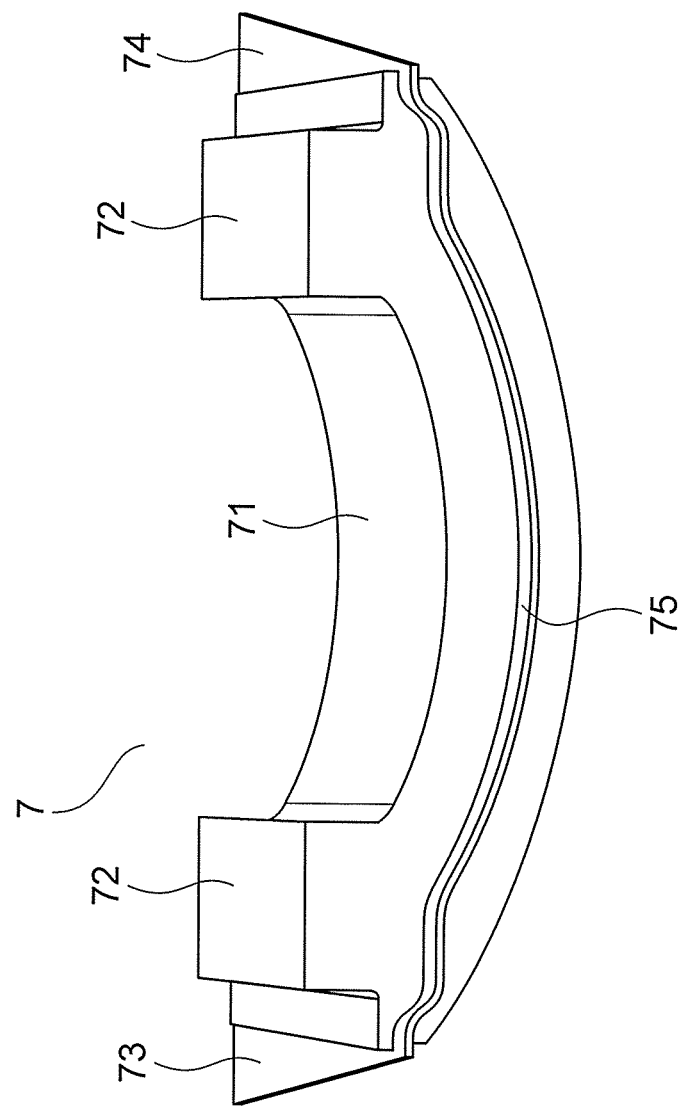
FIG. 8 is a perspective view depicting the connector member in FIG. 7 that is viewed in a direction different from FIG. 7.
Figure 9:
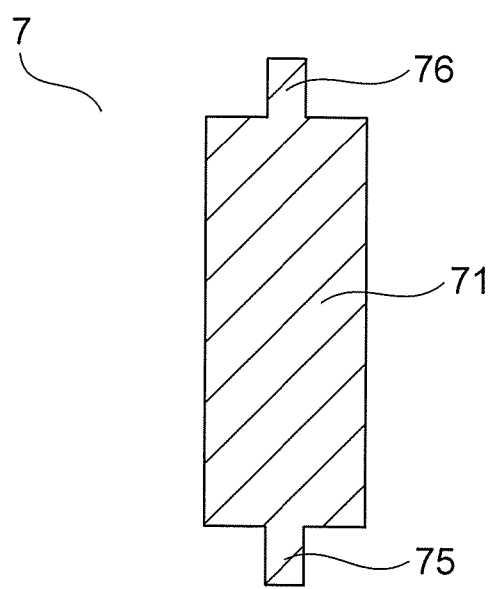
FIG. 9 is a cross-sectional view along the IX-IX line in FIG. 7.

FIG. 7 is a perspective view depicting the connector member 7 in FIG. 2. FIG. 8 is a perspective view depicting a state when the connector member 7 in FIG. 7 is viewed from a direction that is different from FIG. 7. FIG. 9 is a cross-sectional view along the IX-IX line in FIG. 7. In addition to the above mentioned connector member main unit 71, the connector member 7 has: a pair of peripheral wall side insertion plates 73 and 74 which individually protrude from the connector member main unit 71 toward the first peripheral wall edge portion 621 and the second peripheral wall edge portion 622 respectively; a base plate side insertion plate 75 which protrudes from the connector member main unit 71 toward the base plate 61; and a cover side insertion plate 76 which protrudes from the connector member main unit 71 toward the cover 5.

Each peripheral wall side insertion plate 73 and 74 is a tapered plate of which degree of protrusion from the side surface facing the first and second peripheral wall edge portions 621 and 622 of the connector member main unit 71 continuously decreases as the distance to the base plate side insertion plate 75 decreases. The peripheral wall side insertion plate 73 is inserted into the peripheral wall groove 63 in accordance with the inclination of the bottom surface 63a of the peripheral wall groove 63, and the peripheral wall side insertion plate 74 is inserted into the peripheral wall groove 64 in accordance with the inclination of the bottom surface 64a of the peripheral wall groove 64. The peripheral wall side insertion plates 73 and 74 are inserted into the peripheral wall grooves 63 and 64 respectively in a state of being apart from the inner surfaces of the peripheral wall grooves 63 and 64 based on the positioning of the connector member 7 with respect to the base plate 61.

The base plate side insertion plate 75 is disposed along the base plate groove 65. The base plate side insertion plate 75 is inserted into the base plate groove 65 in a state of being apart from the inner surface of the base plate groove 65 based on the positioning of the connector member 7 with respect to the base plate 61, as illustrated in FIG. 3.

Into the spaces formed between the respective inner surface of each peripheral wall groove 63 and 64 and the base plate groove 65 and the connector member 7, a seal material 10, which is a flexible rubber-like material, is filled. In other words, the rubber-like seal material 10 is filled into the space surrounded by each outer surface of the connector member main unit 71 and the peripheral wall side insertion plate 73, and the inner surface of the peripheral wall groove 63, the space surrounded by each outer surface of the connector member main unit 71 and the peripheral wall side insertion plate 74, and the inner surface of the peripheral wall groove 64, and the space surrounded by each outer surface of the connector member main unit 71 and the base plate side insertion plate 75, and the inner surface of the base plate groove 65 respectively. The seal material 10 is constituted of a material which is paste-like but hardens to be rubber-like. The same type of rubber-like seal material 10 is also filled into the seal material containing portion 66. Thereby the seal performance in the boundary between the case member 6 and the connector member 7 is ensured.

In the connector member 7, a pair of protective plates 77 and 78, which protrude from the connector member main unit 71 and face, with a gap, the outer peripheral surfaces of the first peripheral wall edge portion 621 and the second peripheral wall edge portion 622 respectively, are disposed. The protective plate 77 covers the boundary between the first peripheral wall edge portion 621 and the connector member main unit 71, and the protective plate 78 covers the boundary between the second peripheral wall edge portion 622 and the connector member main unit 71. Thereby the seal material 10, which extends from the peripheral wall groove 63 to outside the case assembly 4, can be confined to the space between the first peripheral wall edge portion 621 and the protective plate 77, and the seal material 10, which extends from the peripheral wall groove 64 to outside the case assembly 4, can be confined to the space between the second peripheral wall edge portion 622 and the protective plate 78. The connector member main unit 71, each protrusion 72, each peripheral wall side insertion plate 73 and 74, the base plate side insertion plate 75, the cover side insertion plate 76, and each protective plate 77 and 78 are formed by integral resin molding.

Figure 10:
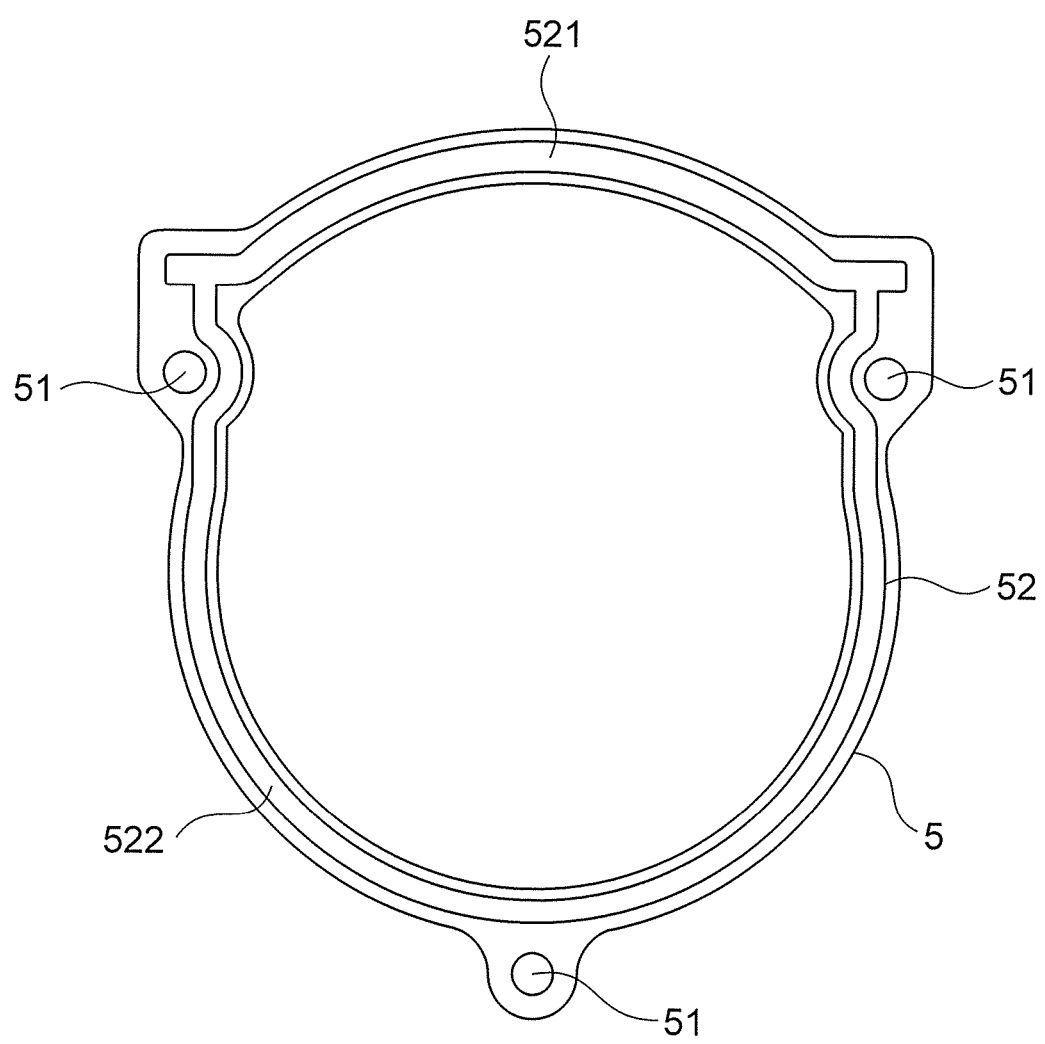
FIG. 10 is a front view depicting the cover in FIG. 1.
Figure 11:
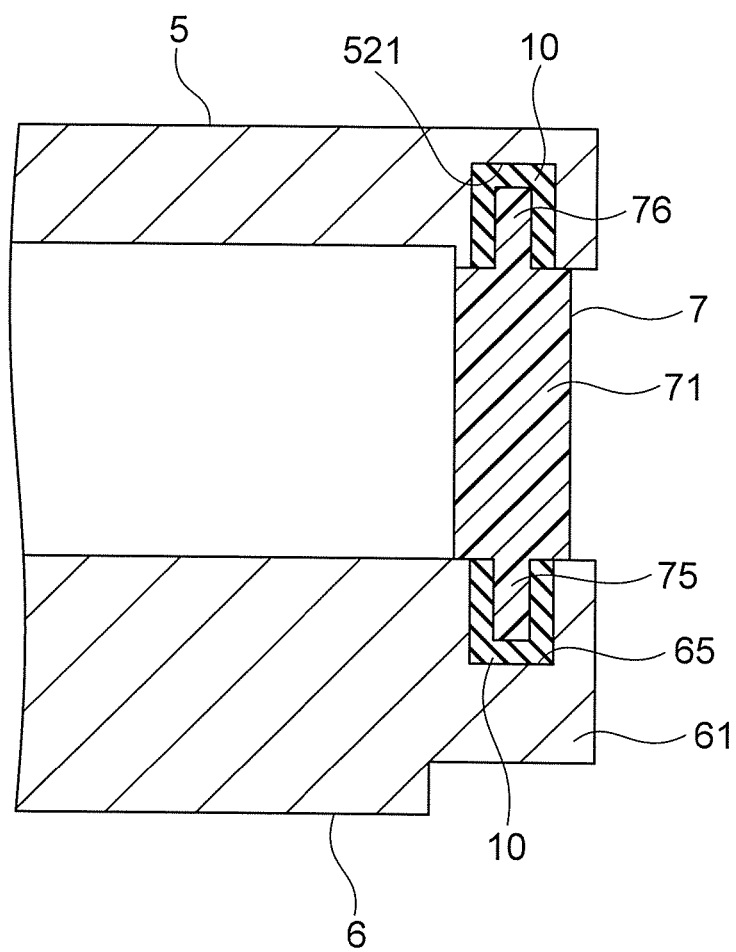
FIG. 11 is a cross-sectional view along the XI-XI line in FIG. 1.

FIG. 10 is a front view depicting the cover 5 in FIG. 1. FIG. 11 is a cross-sectional view along the IX-IX line in FIG. 1. On the outer periphery of the cover 5, a plurality of (3 in this example) screw holes 51, through which screws (not illustrated) are inserted to fix the covers 5 to the peripheral wall 62, are formed. On the surface of the cover 5 on the case assembly 4 side, a cover groove 52 is disposed along the connector member 7 and the peripheral wall 62.

The cover groove 52 includes a connector member cover groove portion 521 along the connector member 7, and a peripheral wall cover groove portion 522 along the peripheral wall 62. The cover groove 52 is formed in a loop inter-connecting the connector member cover groove portion 521 and the peripheral wall cover groove portion 522.

A cover side insertion plate 76 is disposed along the connector member cover groove portion 521. As illustrated in FIG. 7, the cover side insertion plate 76 is disposed not only in the range of the connector member main unit 71, but also in the range of each peripheral wall side insertion plate 73 and 74. Further, as illustrated in FIG. 11, the cover side insertion plate 76 is inserted into the connector member cover groove portion 521 in the state of being apart from the inner surface of the connector member cover groove portion 521.

In the space formed between the inner surface of the connector member cover groove portion 521 and the connector member 7, a seal material 10, which is the same type as the seal material filled into the space between each inner surface of the peripheral wall grooves 63 and 64 and the base plate groove 65, and the connector member 7, is filled. In other words, the rubber-like seal material 10 is filed into the space surrounded by each outer surface of the connector member main unit 71 and the cover side insertion plate 76, and the inner surface of the connector member cover groove portion 521.

The opening of the peripheral wall cover groove portion 522 is closed by the seal surface 62a formed on the peripheral wall 62. In the space formed between the inner surface of the peripheral wall cover groove portion 522 and the seal surface 62a of the peripheral wall 62, the rubber-like seal material 10, which is the same type as the seal material filled into the space between the inner surface of the connector member cover groove portion 521 and the connector member 7, is filled. Thereby the seal performance in the boundary between the case assembly 4 and the cover 5 is ensured.

A method for manufacturing the waterproof type control unit 1 will be described next. When the waterproof type control unit 1 is manufactured, the paste-like seal material is injected into the base plate groove 65 and the pair of peripheral wall grooves 63 and 64 disposed in the case member 6, so as to coat the seal material on the case member 6. At this time, a coating machine for injecting the seal material into the base plate groove 65 and the pair of peripheral wall grooves 63 and 64 is installed such that the injection needle to eject the seal material is perpendicular to the case member bottom surface 611. As time elapses, the seal material hardens and changes from a paste-like state to a flexible rubber-like state.

Figure 12:
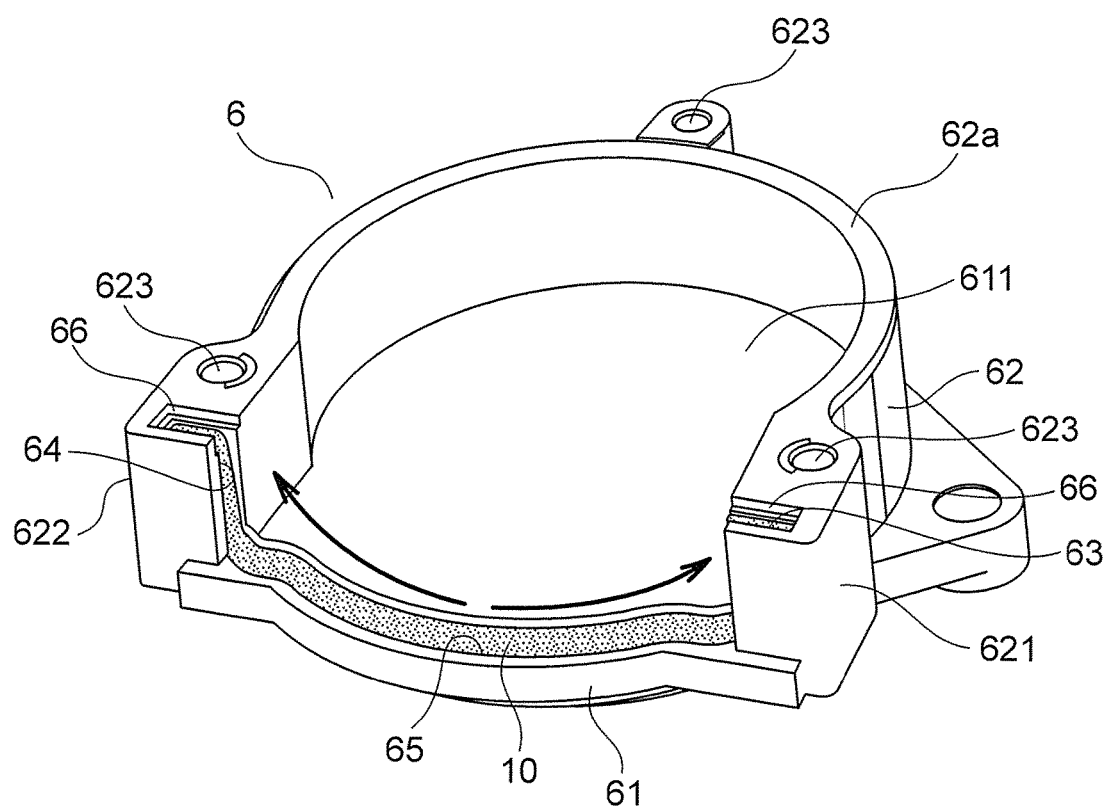
FIG. 12 is a perspective view depicting a state where a paste-like seal material is coated on the case member in FIG. 4.

FIG. 12 is a perspective view depicting a state where the paste-like seal material is coated on the case member 6 in FIG. 4. When the seal material is injected into the base plate groove 65 and the pair of peripheral wall grooves 63 and 64, the seal material is continuously injected from an intermediate position of the base plate groove 65 in the sequence of the base plate groove 65 and one peripheral wall groove 63, as indicated by the arrow mark in FIG. 12. In other words, the seal material is injected into the base plate groove 65 from the intermediate position of the base plate groove 65 toward one peripheral wall groove 63, and the seal material is continuously injected into this peripheral wall groove 63 (first seal material injection step). Then, from the intermediate position of the base plate groove 65, the seal material is continuously injected into the base plate groove 65 and the other peripheral wall groove 64. In other words, the seal material is injected into the remaining portion of the base plate groove 65 from the intermediate position of the base plate groove 65 toward the other peripheral wall groove 64, and the seal material is continuously injected into this peripheral wall groove 64 (second seal material injection step).

Figure 13:
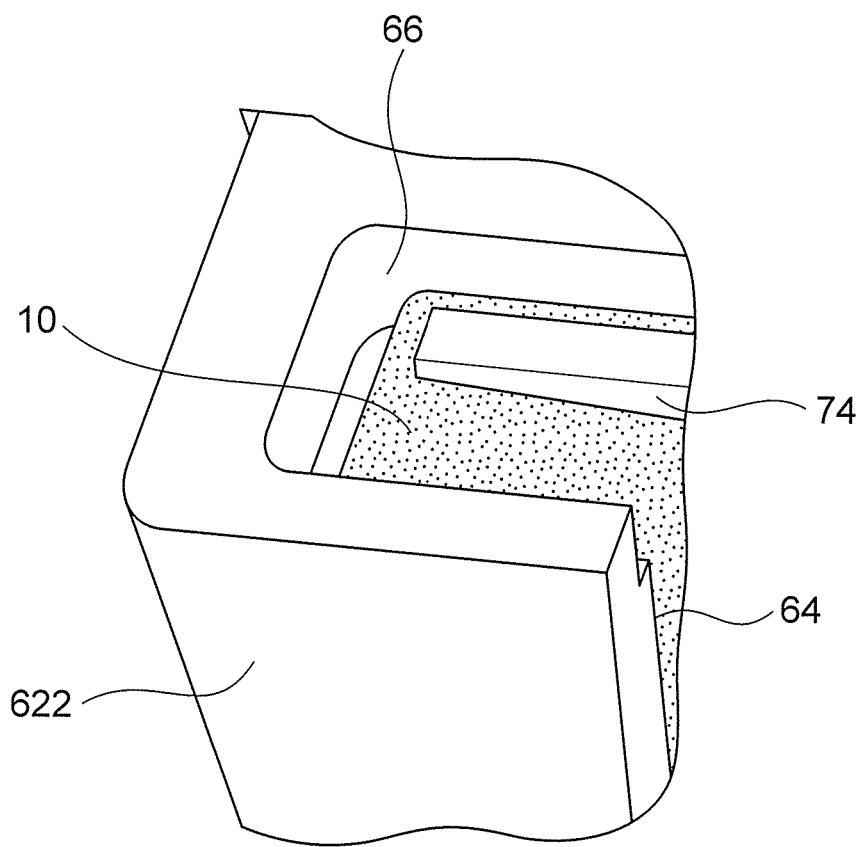
FIG. 13 is a perspective view depicting a seal material containing portion disposed at a second peripheral wall edge portion in FIG. 2.

In the first and second seal material injection steps, the coating machine is operated while changing the vertical and horizontal positions of the injection needle, without changing the orientation of the injection needle, so as to inject the seal material into the base plate groove 65 and the pair of peripheral wall grooves 63 and 64. Further, in the first and second seal material injection steps, a space, which is not filled with the seal material, is secured in each seal material containing portion 66, as illustrated in FIG. 13. The sequence of the first and second seal material injection steps may be reversed.

Then before the seal material coated on the case member 6 hardens, the connector member 7 is attached to the case member 6. Thereby the case assembly 4 illustrated in FIG. 2 is completed. By this step, the controller is also housed inside the case assembly 4, and the electric connection between the external connection terminal of the connector member 7 and the controller is also completed. When the connector member 7 is attached to the case member 6, the base plate side insertion plate 75 is inserted into the base plate groove 65, and the connector member main unit 71 is disposed in the space between the first peripheral wall edge portion 621 and the second peripheral wall edge portion 622, while independently inserting each peripheral wall side insertion plate 73 and 74 into each peripheral wall groove 63 and 64. Thereby the seal material is filled into the space between the inner surface of the base plate groove 65 and the base plate side insertion plate 75, and the seal material is filled into the space between the respective inner surface of each peripheral wall groove 63 and 64 and each peripheral wall side insertion plate 73 and 74, and the seal performance in the boundary between the case member 6 and the connector member 7 is ensured.

If each peripheral wall side insertion plate 73 and 74 is independently inserted into each peripheral wall groove 63 and 64, the seal material injected into each peripheral wall groove 63 and 64 may be pushed by each peripheral wall side insertion plate 73 and 74, and extend outside the case member 6 from each peripheral wall groove 63 and 64. However, the seal material is can flow into the seal material containing portion 66 disposed in the edge portion of each peripheral wall groove 63 and 64, and extension of the seal material to outside the case member 6 is prevented. Further, even if the seal member extends to outside the case member 6, the seal material is confined to the space between the first or the second peripheral wall edge portion 621 and 622 and each protective plate 77 and 78. Thereby the extension of the seal material to outside the case assembly 4 is prevented, and the seal material will rarely adhere to, for instance, the hands of an operator even if the operator performs the operation holding the case assembly 4 by hand (connector member attachment step).

Figure 14:
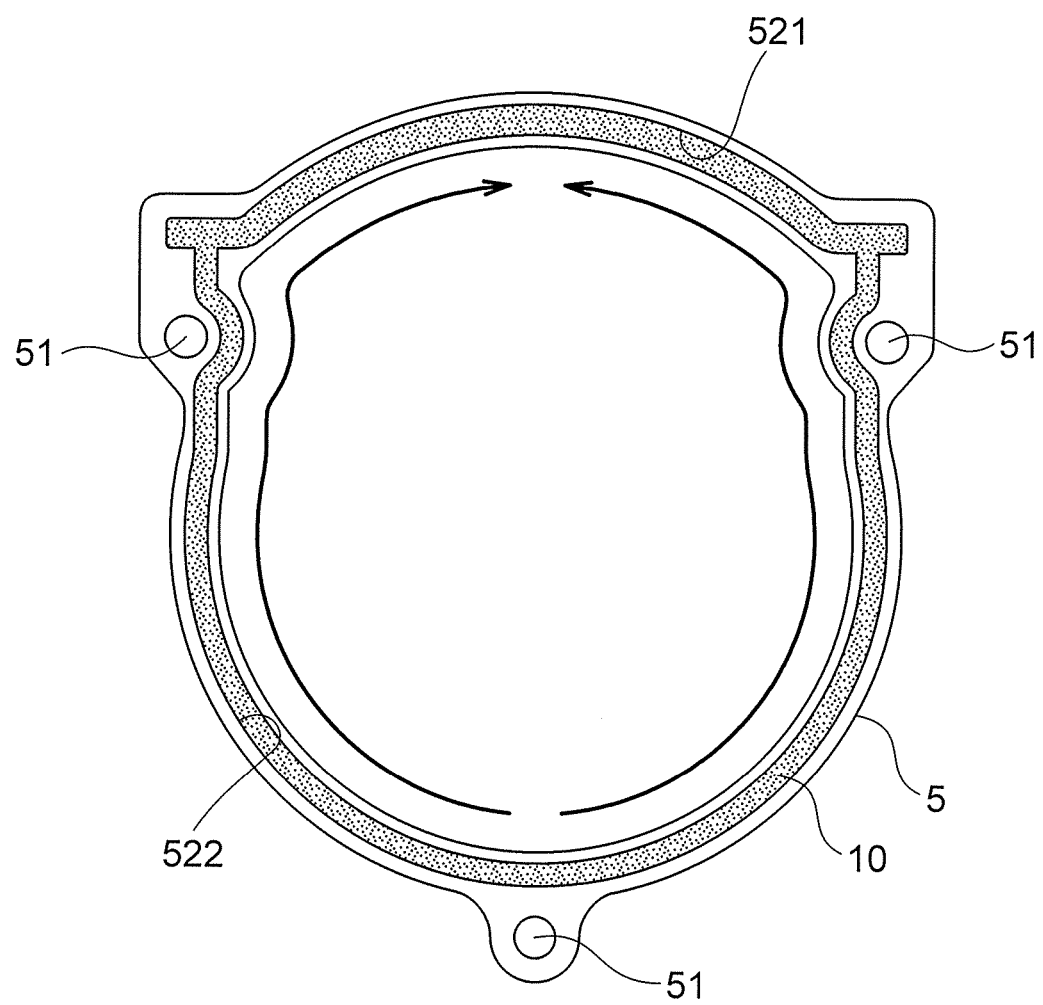
FIG. 14 is a front view depicting a state where the seal material is coated on the cover in FIG. 10.

Then the paste-like seal material is injected into the cover groove 52 so that the seal material is coated on the cover 5. FIG. 14 is a front view depicting the state where the seal material is coated on the cover 5 in FIG. 10. As the arrow in FIG. 14 indicates, the seal material is injected continuously in the sequence of the peripheral wall cover groove portion 522 and the connector member cover groove portion 521 by moving the injection needle from the intermediate position of the peripheral wall cover groove portion 522 to the intermediate position of the connector member cover groove portion 521 in the forward direction (that is, the clockwise direction in FIG. 14). Then the seal material is injected continuously in the sequence of the peripheral wall cover groove portion 522 and the connector member cover groove portion 521 by moving the injection needle from the intermediate position of the peripheral wall cover groove portion 522 to the intermediate position of the connector member cover groove portion 521 in the backward direction (that is, the counterclockwise direction in FIG. 14). The injection needle may be moved in the forward direction first or in the backward direction first. At this time, a somewhat higher amount of the seal material is injected into both edge portions of the connector member cover groove portion 521, compared with the other portions of the connector member cover groove portion 521, since both edge portions of the connector member cover groove portion 521 face the seal material containing portions 66, respectively. Further, at this time, the coating machine injects the seal material into the cover groove 52 through the injection needle, without changing the orientation of the injection needle (cover side seal material injection step).

Then before the seal material coated on the cover groove 52 hardens, the opening 3 formed by the peripheral wall 62 and the connector member main unit 71 is closed by the cover 5, while inserting the cover side insertion plate 76 into the connector member cover groove portion 521. In other words, the opening 3 is closed by the cover 5 so that the seal material is filled into the space between each of the peripheral wall 62 and the connector member main unit 71, and the inner surface of the cover groove 52. Thereby the seal material is filled into the space between the inner surface of the connector member cover groove portion 521 and the cover side insertion plate 76, and the seal material is filled into the space between the inner surface of the peripheral wall cover groove portion 522 and the seal surface 62*a*, and the seal performance in the boundary between the case assembly 4 and the cover 5 is ensured (cover installation step). Then the seal material hardens, whereby the waterproof type control unit 1 is completed.

According to this waterproof type control unit 1, each bottom surface of each peripheral wall groove 63 and 64 disposed in the first and second peripheral wall edge portion 621 and 622 is inclined with respect to the case member bottom surface 611 of the base plate 61, and the base plate groove 65 connecting each peripheral wall groove 63 and 64 is disposed in the case member bottom surface 611, hence the seal material can be injected into the peripheral wall grooves 63 and 64 and the base plate groove 65 respectively through the injection needle for injecting the seal material, without changing the orientation of the injection needle with respect to the case member bottom surface 611 by maintaining the orientation of the injection needle perpendicular to the case member bottom surface 611, for example. Thereby the operation to coat the seal material to the case member 6 becomes easy, and the time required for manufacturing the waterproof type control unit 1 can be decreased.

The connector member 7 has: a pair of tapered peripheral wall side insertion plates 73 and 74, which protrude from the connector member main unit 71, are inserted into each peripheral wall groove 63 and 64 in accordance with the inclination of the bottom surfaces of each peripheral wall groove 63 and 64; and a base plate side insertion plate 75 which protrudes from the connector member main unit 71 and is inserted into the base plate groove 65, hence the seal material can be filled with certainty into the space between the inner surface of each peripheral wall groove 63 and 64 and each peripheral wall side insertion plate 73 and 74, and the space between the inner surface of the base plate groove 65 and the base plate side insertion plate 75, and the seal performance in the boundary between the connector member 7 and the case member 6 can be ensured with higher certainty.

In the connector member 7, a pair of protective plates 77 and 78, which protrude from the connector member main unit 71 and face the outer peripheral surfaces of the first and second peripheral wall end portions 621 and 622 respectively with spacing, are disposed, hence even if the seal material extends to outside the case assembly 4 from each peripheral wall groove 63 and 64, the seal material can be confined to the space between the outer peripheral surfaces of the first and second peripheral wall end portions 621 and 622 and the protective plates 77 and 78. Thereby the filling state of the seal material can be visually checked more easily, and adhesion of the seal material on the case assembly 4 to the hands of the operator can be prevented, and as a result, the waterproof type control unit 1 can be manufactured more efficiently.

Further, the seal material containing portion 66 is disposed in the edge portion of each peripheral wall groove 63 and 64 on the cover 5 side, hence the seal material can flow from each peripheral wall groove 63 and 64 to the seal material containing portion 66. Thereby extension of the seal material from each peripheral wall groove 63 and 64 can be prevented, and the waterproof type control unit 1 can be manufactured more efficiently.

Further, the cover groove 52 is disposed on the surface of the cover 5 on the case assembly 4 side, and the seal material is filled into the space between each of the connector member 7 and the peripheral wall 62, and the inner surface of the cover groove 52 respectively, hence the seal performance in the boundary between the cover 5 and the case assembly 4 can be ensured with higher certainty.

Further, the connector member 7 includes the cover side insertion plate 76, which protrudes from the connector member main unit 71 and is inserted into the cover groove 52, hence the seal material can be filled into the space between the inner surface of the cover groove 52 and the cover side insertion plate 76 with certainty, and the seal performance in the boundary between the cover 5 and the connector member 7 can be ensured with higher certainty.

Further, when the connector member 7 is viewed from the cover 5 side, the shape of the connector member main unit 71 has a curved shape, which curves outward from the case assembly 4, with respect to the line connecting the first peripheral wall edge portion 621 and the second peripheral wall edge portion 622, hence the capacity inside the case 2 can be increased.

Further, the case member 6 and the cover 5 are constituted of the same material, hence the linear expansion coefficients of the case member 6 and the cover 5 can be the same. As a result, the difference of the volume change amount between the case member 6 and the cover 5 caused by heat can be minimized, and deterioration of the seal performance in the boundary between the case member 6 and the cover 5 caused by heat can be suppressed.

Further, according to the method for manufacturing the waterproof type control unit 1, when the seal material is injected into each peripheral wall groove 63 and 64 and the base plate groove 65 of the case member 6, the seal material is injected from the intermediate position of the base plate groove 65 continuously in the sequence of the base plate groove 65 and one peripheral wall groove 63, and the seal material is injected from the intermediate position of the base plate groove 65 continuously in the sequence of the base plate groove 65 and the other peripheral wall groove 64, hence the number of times of the injection operation of the seal material using the injection needle is two times, and the seal material can be easily injected into each peripheral wall groove 63 and 64 and the base plate groove 65.

Embodiment 2

Figure 15:
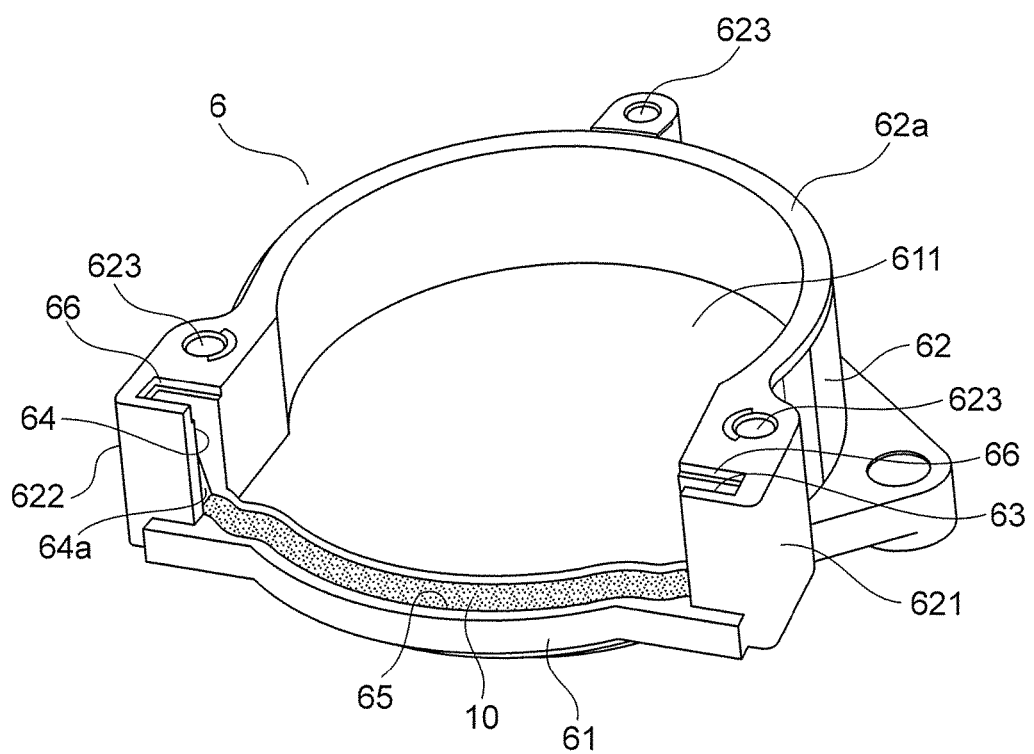
FIG. 15 is a perspective view depicting a state where the seal material is coated on a case member according to Embodiment 2 of this invention.

In this embodiment, the procedure to fabricate the case assembly 4 is different from Embodiment 1. FIG. 15 is a perspective view depicting the state when the seal material is coated on the case member 6 according to Embodiment 2. When the case assembly 4 is fabricated, the paste-like seal material is injected into the entire base plate groove 65 first, using the injection needle of the coating machine (base plate groove seal material injection step).

Then the connector member 7 is attached to the case member 6 before the seal material injected into the base plate groove 65 hardens. At this time, the base plate side insertion plate 75 is inserted into the base plate groove 65, and the connector member main unit 71 is disposed in the space between the first peripheral wall edge portion 621 and the second peripheral wall edge portion 622 while individually inserting each peripheral wall side insertion plate 73 and 74 into each peripheral wall groove 63 and 64. Thereby the seal material is filled into the space between the inner surface of the base plate groove 65 and the base plate side insertion plate 75. In this state, the seal material is not yet filled into the space between the inner surface of each peripheral wall groove 63 and 64 and each peripheral wall side insertion plate 73 and 74 (connector member attachment step).

Figure 16:
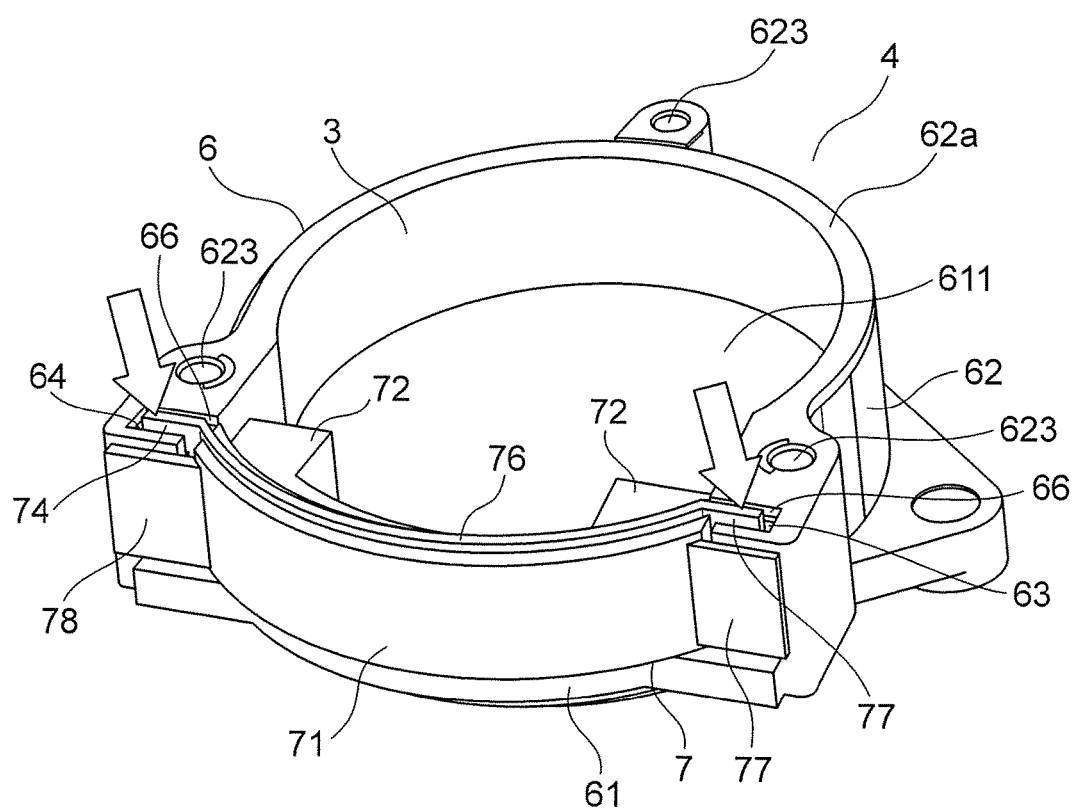
FIG. 16 is a perspective view depicting a state where the connector member is attached to the case member in FIG. 15.

FIG. 16 is a perspective view depicting a state where the connector member 7 is attached to the case member 6 in FIG. 15. After the connector member attachment step, the paste-like seal material is injected from the open portion of each peripheral wall groove 63 and 64 on the cover 5 side into each peripheral wall groove 63 and 64 using the injection needle of the coating machine, as the arrow marks in FIG. 16 indicate. Thereby the seal material is filled into the space between the inner surface of each peripheral wall groove 63 and 64 and each peripheral wall side insertion plate 73 and 74, and the seal performance in the boundary between the case member 6 and the connector member 7 is ensured (peripheral wall groove seal material injection step). In this way, the case assembly 4 is fabricated. The subsequent procedures and the configuration of the waterproof type control unit 1 are the same as Embodiment 1.

According to this method for manufacturing the waterproof type control unit 1, the seal material is injected into each peripheral wall groove 63 and 64 after attaching the connector member 7 in the case member 6, hence extension of the seal material from each peripheral wall groove 63 and 64 can be prevented, and less amount of seal material can be used. Thereby the manufacturing cost of the waterproof type control unit 1 can be reduced.

In the above example, each peripheral wall side insertion plate 73 and 74 protrudes from the connector member main unit 71, but the degree of protrusion of each peripheral wall side insertion plate 73 and 74 may be decreased, or each peripheral wall side insertion plate 73 and 74 may be omitted. Thereby the open portion of each peripheral wall groove 63 and 64 at the edge on the cover 5 side can be enlarged, which makes it easier to inject the seal material into each peripheral wall groove 63 and 64 in the second seal material injection step.

Further, the cross-sectional shape of the injection needle of the coating machine may be matched with the cross-sectional shape of the space formed by the inner surface of the edge portion of each peripheral wall groove 63 and 64 on the cover 5 side and the connector member 7. Thereby the seal material can be easily injected in the second seal material injection step, and the seal material can be filled into each peripheral wall groove 63 and 64 with higher certainty.

Embodiment 3

Figure 17:
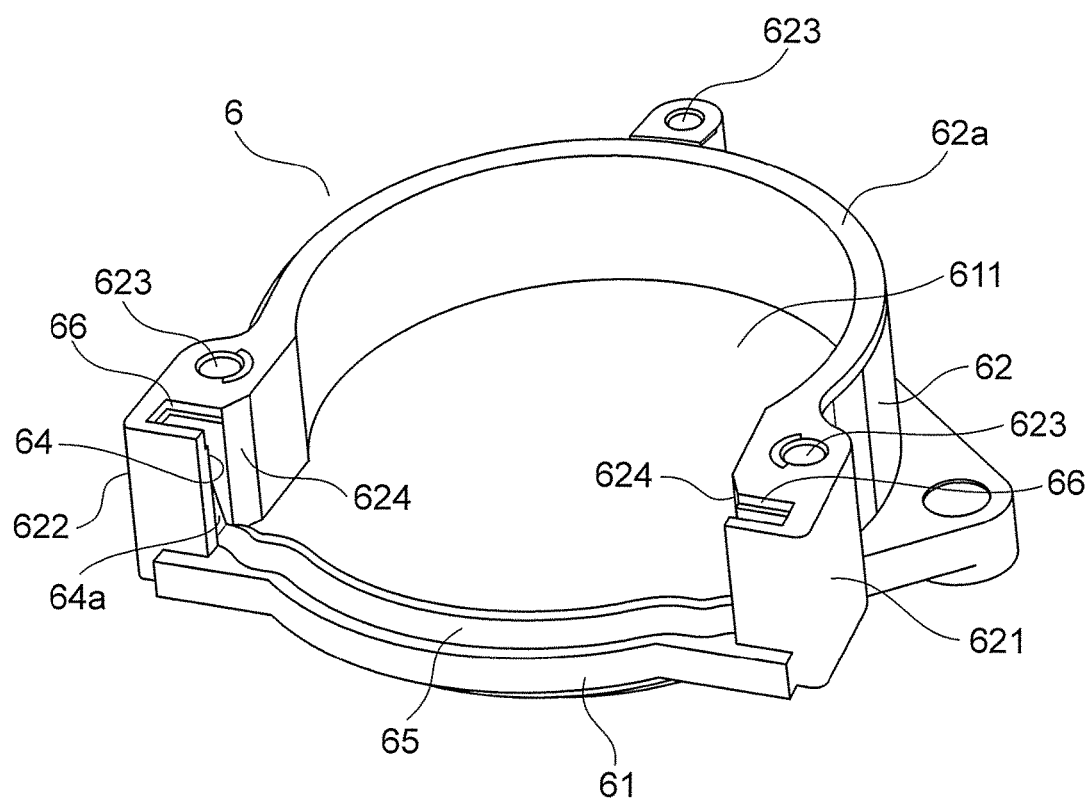
FIG. 17 is a perspective view depicting a case member of a waterproof type control unit according to Embodiment 3 of this invention.

FIG. 17 is a perspective view depicting a case member 6 of the waterproof type control unit 1 according to Embodiment 3 of this invention. Each of the first peripheral wall edge portion 621 and the second peripheral wall edge portion 622 has a slope 624, which inclines from the inner surface of each peripheral wall groove 63 and 64 toward the interior of the case 2 in a direction of expanding the space between each slope and the connector member 7. The rest of the configuration is the same as Embodiment 1. The manufacturing procedure of the waterproof type control unit 1 is also the same as Embodiment 1.

According to this waterproof type control unit 1, the slope 624, which inclines from the inner surface of each peripheral wall groove 63 and 64 toward the interior of the case 2 in a direction of expanding the space with each slope and the connector member 7, is disposed in the first and second peripheral wall edge portion 621 and 622 respectively, hence the paste-like seal material can be extended intentionally from each peripheral wall groove 63 and 64 into the case 2. Thereby extension of the seal material out of the case assembly 4 is prevented, and adhesion of the seal material to, for instance, the hands of the operator can be prevented. Since the seal material hardly extends out of the case assembly 4, the amount of the seal material to be injected into each peripheral wall groove 63 and 64 can be increased, and the seal material can be filled into the space between the inner surface of each peripheral wall groove 63 and 64 and the connector member 7 with higher certainty. As a result, the seal performance in the boundary between the case member 6 and the connector member 7 can be further improved.

In the above example, the manufacturing procedure of the waterproof type control unit 1 is the same as Embodiment 1, but the waterproof type control unit 1 may be manufactured according to the same procedure as Embodiment 2.

Embodiment 4

Figure 18:
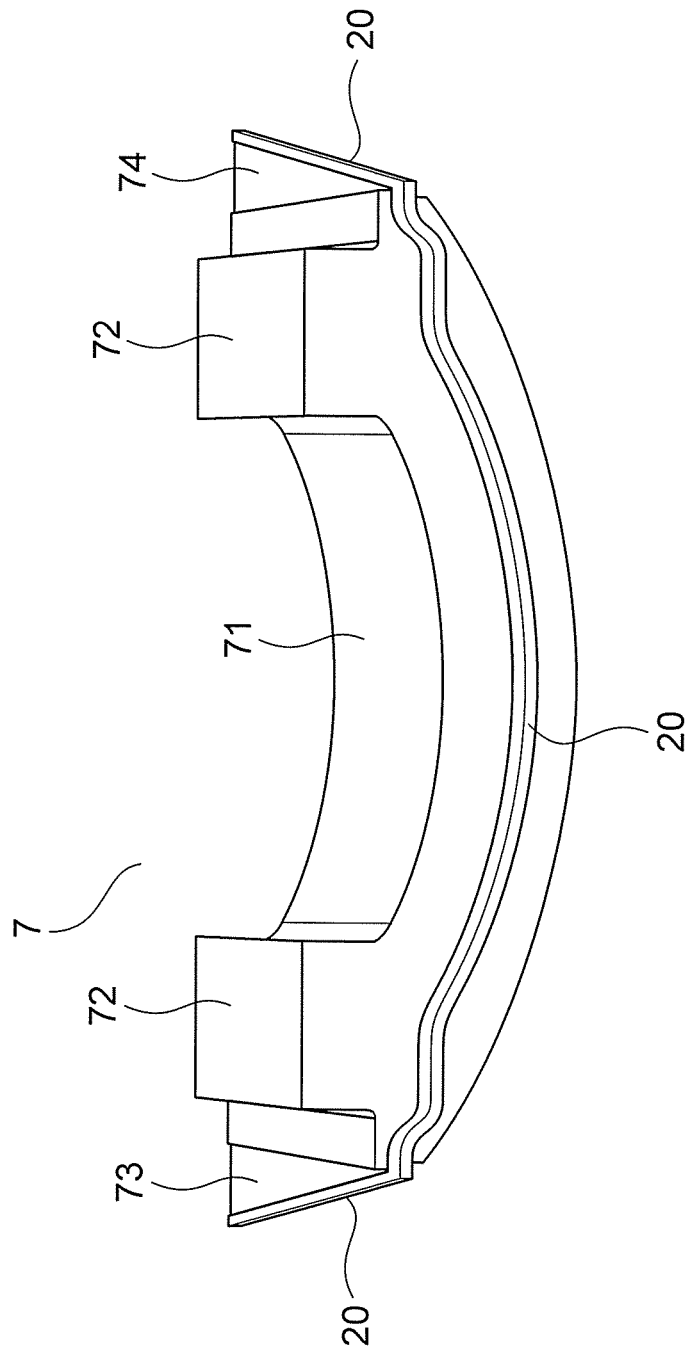
FIG. 18 is a perspective view depicting a connector member of a waterproof type control unit according to Embodiment 4 of this invention.

FIG. 18 is a perspective view depicting a connector member 7 of the waterproof type control unit 1 according to Embodiment 4 of this invention. In this connector member 7, a packing 20, which is a flexible resin material, is disposed along each peripheral wall groove 63 and 64 and the base plate groove 65 respectively. In this example, the packing 20 is disposed in the slope portions of each peripheral wall side insertion plate 73 and 74 facing the bottom surface of each peripheral wall groove 63 and 64, and the base plate side insertion plate 75 respectively. Further, in this example, a rubber packing 20 (e.g. made of silicon rubber) is disposed in the connector member 7.

In each packing 20, a fitting groove (not illustrated) is disposed. Each packing 20 disposed in each peripheral wall side insertion plate 73 and 74 individually adheres to the inner surface of each peripheral wall groove 63 and 64 in the state of being fitted to each peripheral wall side insertion plate 73 and 74. The packing 20 disposed in the base plate side insertion plate 75 adheres to the inner surface of the base plate groove 65 in the state of being fitted to the base plate side insertion plate 75. The seal material is filled into the space formed between each inner surface of the peripheral wall grooves 63 and 64 and the base plate groove 65 and the connector member 7, so as to fill the space around the packing 20. The rest of the configuration is the same as Embodiment 1.

A method for manufacturing the waterproof type control unit 1 will be described next. When the waterproof type control unit 1 is manufactured, the packing 20 is installed in each peripheral wall side insertion plate 73 and 74 and the base plate side insertion plate 75 of the connector member 7 respectively in advance (resin material installation step). Further, the first and second seal material injection steps are performed in the same manner as Embodiment 1, and the paste-like seal material is coated on the case member 6.

Then the packing 20 installed in advance in the connector member 7 in the resin material installation step adheres to each inner surface of the peripheral wall groove 63 and 64 and the base plate groove 65 respectively, and while individually inserting each peripheral wall side insertion plate 73 and 74 and the base plate side insertion plate 75 into each peripheral wall groove 63 and 64 and the base plate groove 65 respectively, the connector member main unit 71 is disposed in the space between the first peripheral wall edge portion 621 and the second peripheral wall edge portion 622. At this time, the paste-like seal materials changes the form along the shape of the packing 20, and fills the space around the packing 20. As a result, the packing 20 and the seal material fill the space between the inner surface of the base plate groove 65 and the base plate side insertion plate 75, and the packing 20 and the seal material fill the space between the inner surface of each peripheral wall groove 63 and 64 and each peripheral wall side insertion plate 73 and 74, whereby the seal performance in the boundary between the case member 6 and the connector member 7 is ensured (connector member attachment step). The subsequent procedure is the same as Embodiment 1.

In this waterproof type control unit 1, the flexible packing 20 is disposed in the connector member 7 along each peripheral wall groove 63 and 64 and the base plate groove 65 respectively, and the packing 20 adheres to the inner surface of each peripheral wall groove 63 and 64 and the base plate groove 65 respectively, hence the seal performance in the boundary between the case member 6 and the connector member 7 can be further improved by the packing 20 and the seal material.

Further, according to the method for manufacturing the waterproof type control unit 1, the flexible packing 20, which is installed in the connector member 7 in advance, adheres to each inner surface of each peripheral wall groove 63 and 64 and the base plate groove 65, hence the packing 20 can easily contact the respective inner surface of each peripheral wall groove 63 and 64 and the base plate groove 65.

In the above example, after injecting the seal material into each peripheral wall groove 63 and 64, the connector member attachment step of attaching the connector member 7, in which the packing 20 has been installed in advance, in the case member 6, is performed, but the connector member attachment step of attaching the connector member 7, in which the packing 20 has been installed in advance, in the case member 6, may be performed after performing the base plate groove seal material injection step of injecting the seal material into the base plate groove 65 and before injecting the seal material into each peripheral wall groove 63 and 64, in the same manner as Embodiment 2, and then the peripheral wall groove seal material injection step of injecting the seal material into each peripheral wall groove 63 and 64 may be performed.

Further, according to the above example, the packing 20 adheres to the respective inner surface of each peripheral wall groove 63 and 64 and the base plate groove 65 of the case member 6 of Embodiment 1, but the case assembly 4 may be constructed by adhering the packing 20 to the respective inner surface of each peripheral wall groove 63 and 64 and the base plate groove 65 of the case member 6 in which the slope 624 is disposed in Embodiment 3.

Further, according to each of the above embodiments, the pair of peripheral wall side insertion plates 73 and 74, the base plate side insertion plate 75, and the cover side insertion plate 76 protrude from the connector member main unit 71, but at least one of each peripheral wall side insertion plate 73 and 74, the base plate side insertion plate 75, and the cover side insertion plate 76 may be omitted as long as the seal performance by the seal material is ensured in the boundary between each of the case member 6 and the cover 5, and the connector member 7.

Further, according to each of the above embodiments, the pair of protective plates 77 and 78 protrude from the connector member main unit 71, but each protective plate 77 and 78 may be omitted as long as the seal member is unlikely to extend from each peripheral wall groove 63 and 64, or if operation is not affected even if the seal material extends.

Further, according to each of the above embodiments, the case member 6 and the cover 5 are constituted of a same material, and the connector member 7 is constituted of a different material from that of the case member 6 and the cover 5, but the cover 5, the case member 6 and the connector member 7 may be constituted of a same material by constituting each of the case member 6 and the cover 5 by resin, for example. Then the linear expansion coefficients of the cover 5, the case member 6 and the connector member 7 become the same, and deterioration of the seal performance due to temperature change can be prevented in the respective boundary of the cover 5, the case member 6 and the connector member 7. Thereby the reliability of the seal performance in the case 2 can be further improved.

The invention claimed is:

1. A waterproof type control unit, comprising:
a case including a case assembly in which an opening is disposed, and a cover which closes the opening; and
a controller which is housed in the case, wherein
the case assembly includes a case member and a connector member which is attached to the case member,
the case member has: a base plate on which a case member bottom surface is formed; and
a peripheral wall which is fixed to the base plate and which includes a first peripheral wall edge portion and a second peripheral wall edge portion, which are disposed on the case member bottom surface so as to be distant from each other, the peripheral wall surrounding the controller from the first peripheral wall edge portion to the second peripheral wall edge portion,
the connector member includes a connector member main unit, which is disposed in a space between the first peripheral wall edge portion and the second peripheral wall edge portion,
the opening is formed by being surrounded by the peripheral wall and the connector member main unit,
a peripheral wall groove, which is open toward the connector member main unit, is disposed in each of the first peripheral wall edge portion and the second peripheral wall edge portion,
the bottom surface of the peripheral wall groove is inclined with respect to the case member bottom surface,
a base plate groove, which connects the peripheral wall groove disposed in the first peripheral wall edge portion and the peripheral wall groove disposed in the second peripheral wall edge portion, is disposed in the case member bottom surface, and
a seal material is filled into a space formed between an inner surface of the peripheral wall groove and the connector member, and a space formed between an inner surface of the base plate grove and the connector member, wherein
a seal material containing portion, which is a space open toward the cover, is disposed in an edge portion of the peripheral wall groove on the cover side, and
a region of the seal material containing portion is larger than a region of the peripheral wall groove when the first and second peripheral wall edge portions are viewed from the cover side.

2. The waterproof type control unit according to claim 1, wherein
the connector member further includes:
a pair of tapered peripheral wall side insertion plates which protrude from the connector member main unit and are inserted into the peripheral wall grooves in accordance with the inclination of the bottom surfaces of the peripheral wall grooves; and a base plate side insertion plate which protrudes from the connector member main unit and is inserted into the base plate groove.

3. The waterproof type control unit according to claim 1, wherein a pair of protective plates which protrude from the connector member main unit respectively and face outer peripheral surfaces of the first peripheral wall edge portion and the second peripheral wall edge portion via a gap, respectively, are disposed in the connector member.

4. The waterproof type control unit according to claim 1, wherein on each of the first peripheral wall edge portion and the second peripheral wall edge portion, a slope, which is inclined from the inner surface of the peripheral wall groove toward an interior of the case in a direction of increasing the space between each slope and the connector member, is disposed.

5. The waterproof type control unit according to claim 1, wherein a cover groove is disposed on the case assembly side surface of the cover, along the connector member and the peripheral wall, and a seal material is filled into the spaces between each of the connector member and the peripheral wall, and an inner surface of the cover groove.

6. The waterproof type control unit according to claim 5, wherein the connector member further includes a cover side insertion plate which protrudes from the connector member main unit, and is inserted into the cover groove.

7. The waterproof type control unit according to claim 1, wherein a flexible resin material is disposed in the connector member, along the peripheral wall grooves and the base plate groove, respectively, and the resin material contacts closely the inner surfaces of the peripheral wall grooves and the base plate groove.

8. The waterproof type control unit according to claim 1, wherein the connector member main unit is shaped to curve upward further toward the outside of the case assembly than a line connecting the first peripheral wall edge portion and the second peripheral wall edge portion, when the connector member is viewed from the cover side.

9. The waterproof type control unit according to claim 1, wherein materials constituting the case member, the cover, and the connector member respectively are all the same.

10. A waterproof type control unit manufacturing method for manufacturing a waterproof type control unit including a case member, a connector member, an opening, and a cover which closes the opening, the method comprising:

a first seal material injection step of continuously injecting a seal material in a first sequence of a base plate groove and a first peripheral wall groove from an intermediate position of the base plate groove, the base plate groove being disposed in a base plate of the case member, the first peripheral wall groove being disposed in a first peripheral wall edge portion of a peripheral wall fixed to the base plate;

a second seal material injection step of continuously injecting the seal material in a second sequence of the base plate groove and a second peripheral wall groove from an intermediate position of the base plate groove, the second peripheral wall groove being disposed in a second peripheral wall edge portion of the peripheral wall;

a connector member attachment step of attaching the connector member to the case member after the first and second seal material injection steps, by disposing a connector member main unit of the connector member in a space between the first peripheral wall edge portion and the second peripheral wall edge portion; and a cover installing step of closing the opening, which is formed by the peripheral wall and the connector member main unit, by the cover after the connector member attachment step, wherein a first seal material containing portion, which is a first space open toward the cover, is disposed in an edge portion of the first peripheral wall groove on the cover side, a second seal material containing portion, which is a second space open toward the cover, is disposed in an edge portion of the second peripheral wall groove on the cover side, a region of the first seal material containing portion is larger than a region of the first peripheral wall groove when the first peripheral wall edge portion is viewed from the cover side, and a region of the second seal material containing portion is larger than a region of the second peripheral wall groove when the second peripheral wall edge portion is viewed from the cover side.

11. A waterproof type control unit manufacturing method for manufacturing a waterproof type control unit including a case member, a connector member, an opening, and a cover which closes the opening, the method comprising:

a base plate groove seal material injection step of injecting a seal material into a base plate groove, the base plate groove being disposed in a base plate of the case member;

a connector member attachment step of attaching the connector member to the case member after the base plate groove seal material injection step, by disposing a connector member main unit of the connector member in a space between a first peripheral wall edge portion of a peripheral wall fixed to the base plate and a second peripheral wall edge portion of the peripheral wall fixed to the base plate;

a peripheral wall groove seal material injection step of injecting the seal material into spaces between each of inner surfaces of respective peripheral wall grooves disposed in the first and second peripheral wall edge portions and the connector member after the connector member attachment step; and a cover installation step of closing the opening formed by the peripheral wall and the connector member main unit after the peripheral wall groove seal material injection step, wherein a seal material containing portion, which is a space open toward the cover, is disposed in respective edge portions of the respective peripheral wall grooves on the cover side, and a region of the seal material containing portion is larger than a region of the respective peripheral wall grooves when the first and second peripheral wall edge portions are viewed from the cover side.

12. The waterproof type control unit manufacturing method according to claim 10, wherein the connector member attachment step further comprising contacting closely a flexible resin material, which is installed in advance in the connector member, to an inner surface of each of the peripheral wall grooves and an inner surface of the base plate groove.

13. The waterproof type control unit manufacturing method according to claim 10, further comprising:

a cover side seal material injection step of injecting the seal material into a cover groove disposed in the cover, before the cover installation step, wherein in the cover installation step, the opening is closed by the cover so that the seal material is filled into spaces between each of the peripheral wall and the connector member main unit, and an inner surface of the cover groove.

14. The waterproof type control unit manufacturing method according to claim 11, wherein the connector member attachment step further comprising contacting closely a flexible resin material, which is installed in advance in the connector member, to the inner surfaces of each of the peripheral wall grooves and an inner surface of the base plate groove.

15. The waterproof type control unit manufacturing method according to claim 11, further comprising:

a cover side seal material injection step of injecting the seal material into a cover groove disposed in the cover, before the cover installation step, wherein in the cover installation step, the opening is closed by the cover so that the seal material is filled into spaces between each of the peripheral wall and the connector member main unit, and an inner surface of the cover groove.

* * * * *